United States Patent [19]

Tsuchiya et al.

[11] Patent Number: 4,640,381

[45] Date of Patent: Feb. 3, 1987

[54] WALL-MOUNTED RESIN SPEAKER CABINET

[75] Inventors: Yukio Tsuchiya; Yutaka Matsukawa, both of Saitama, Japan

[73] Assignee: Pioneer Electronic Corporation, Tokyo, Japan

[21] Appl. No.: 628,084

[22] Filed: Jul. 5, 1984

[30] Foreign Application Priority Data

Jul. 4, 1983 [JP] Japan ............................... 58-121255

[51] Int. Cl.$^{4}$ ............................................. H05K 5/00

[52] U.S. Cl. .................................. 181/144; 181/146; 181/199

[58] Field of Search ......... 181/150, 151, 146, DIG. 1, 181/145, 148, 144, 171, 199

[56] References Cited

U.S. PATENT DOCUMENTS

| | | | |
|---|---|---|---|
| 3,953,675 | 4/1976 | Babb | 181/148 X |
| 3,982,607 | 9/1976 | Evans | 181/151 X |
| 4,029,170 | 6/1977 | Phillips | 181/148 X |
| 4,032,725 | 6/1977 | McGee | 179/146 R |
| 4,083,426 | 4/1978 | Peugh | 181/155 X |
| 4,161,995 | 7/1979 | Pohlmann et al. | 181/DIG. 1 X |
| 4,177,872 | 12/1979 | Watanabe et al. | 181/171 X |
| 4,296,280 | 10/1981 | Richie | 181/150 X |
| 4,424,881 | 1/1984 | Hattori | 181/150 X |
| 4,454,927 | 6/1984 | Seebinger | 181/150 X |

FOREIGN PATENT DOCUMENTS

| | | | |
|---|---|---|---|
| 0024461 | 3/1981 | European Pat. Off. | 181/150 |

*Primary Examiner*—Benjamin R. Fuller
*Attorney, Agent, or Firm*—Sughrue, Mion, Zinn, Macpeak & Seas

[57] ABSTRACT

A resin-molded wall-mounted speaker cabinet which has a reduced thickness and weight. The four side walls of the cabinet are inclined inwardly towards the back of the cabinet, and a terminal plate is mounted on one of the side walls. A baffle board is fitted into a front opening in the body of the cabinet, and a tweeter and a woofer are mounted in the baffle board. The tweeter and woofer are covered by a grille board and front grille. Adjacent the tweeter and woofer on the front surface of the baffle board is mounted a rigid plate, separated from the baffle board by a sound absorbing layer. The rigid plate may be made of glass, and a picture or the like may be placed behind the glass.

17 Claims, 17 Drawing Figures

WALL-MOUNTED RESIN SPEAKER CABINET

BACKGROUND OF THE INVENTION

The present invention pertains to a speaker cabinet. More particularly, the invention pertains to a speaker cabinet made of a plastic resin material and which is adapted for wall mounting.

Because the speaker is usually the largest of the components of an audio system, it is desirable to design the cabinet of the speaker to adapt well with the interior design of the room where the audio system is to be used and to make maximum use of the available space. Recently, so-called flat speakers have been developed in which the depth of the cabinet is substantially reduced and the speaker can readily be mounted on a wall or the like. Most recently, such flat-type speakers have attained frequency response and sound capacity characteristics comparable with those of larger conventional speakers.

It is an object of the present invention to provide such a wall-mounted speaker cabinet which is made of resin to thereby facilitate mass production, reduce the weight of the cabinet, make the quality of the speakers uniform, and to provide other desirable characteristics.

SUMMARY OF THE INVENTION

In accordance with the present invention, a wall-mounted speaker cabinet is provided which is made of a resin material and which has side walls which slope inwardly toward the back of the cabinet. A signal terminal plate is provided on at least one of these side walls. An elongated rib is integrally formed in the interior of the cabinet, with the forward edge of the rib being abutted against a baffle board. The back of the cabinet is provided with an opening corresponding to a yoke of a speaker, and a heat radiating member disposed in this opening.

DESCRIPTION OF THE PREFERRED EMBODIMENTS

Figure 1:
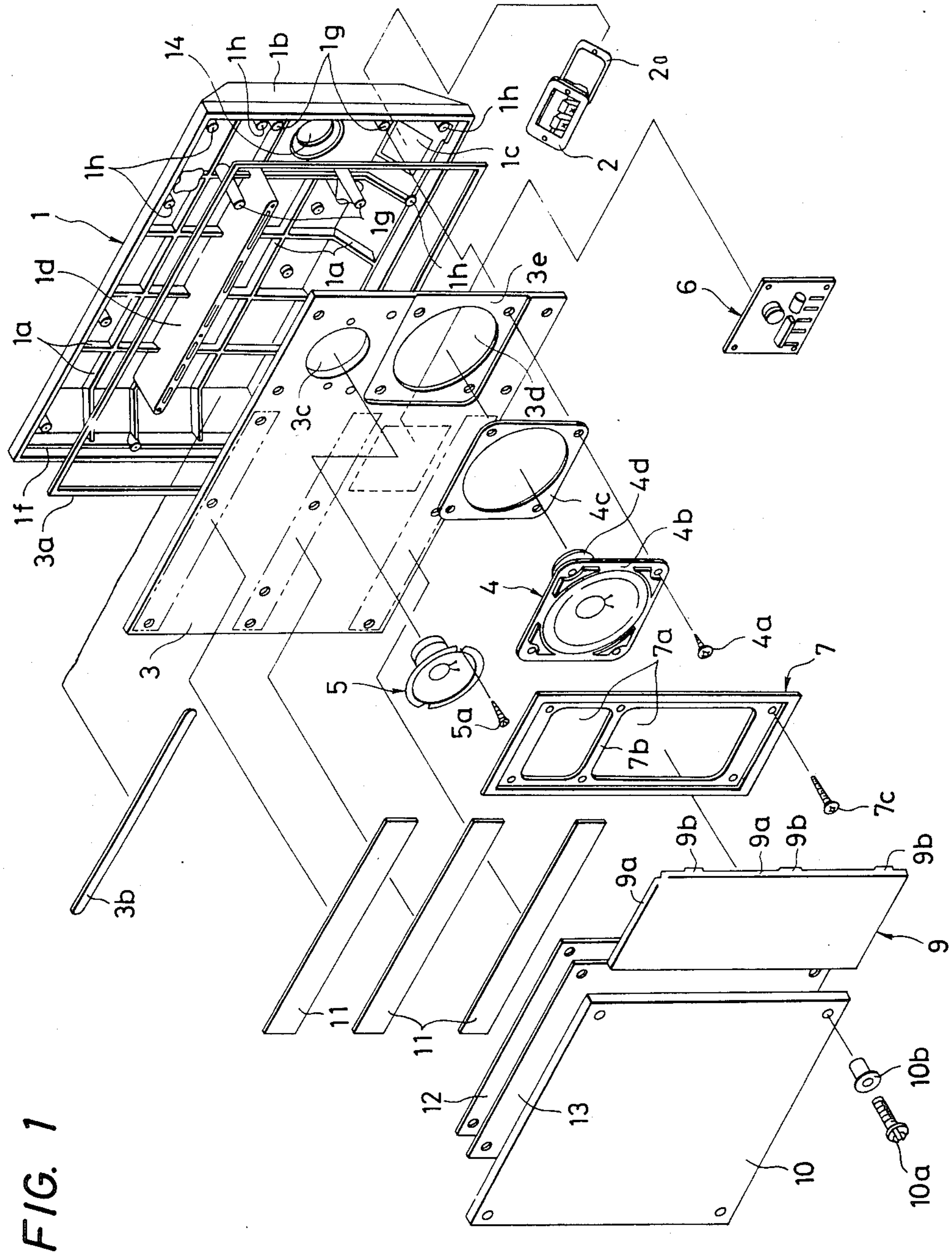
FIG. 1 is an exploded perspective view of a speaker cabinet constructed in accordance with the present invention.

A wall-mounted resin speaker cabinet constructed in accordance with the present invention will now be described with reference to the accompanying drawings. With reference first to FIG. 1, a speaker cabinet body 1 is open over its entire front surface. The speaker cabinet body 1 is formed as an integral unit by molding with a thermoplastic resin such as ABS or the like. The speaker cabinet body 1 is provided in its interior with a plurality of reinforcing ribs 1*a*. The speaker cabinet body 1 has side walls 1*b*, which incline inwardly towards the rear of the cabinet. Due to the provision of these inclined side walls 1*b*, as will be described below in more detail, resonances within the speaker cabinet body 1 and a baffle board employed therein are avoided. Another advantage of the sloped side walls 1*b* is that the cabinet body 1 is easier to mold during an injection molding process. Specifically, due to the provision of the inclined side walls 1*b*, a smoother resin flow is attained, and formation of sink marks is prevented. An opening 1*c* is foremd in one of the inclined side walls 1*b* adjacent one of the corners of the body 1, and a signal terminal plate 2 is secured by screws (not shown) to the body 1 with a sealing member 2*a* interposed around the opening 1*c*.

A longitudinally extending elongated rib 1d is formed in the interior of the cabinet body 1. The elongated rib 1*d* serves to reinforce the cabinet body 1 as a whole, thereby permitting it to be molded as a relatively thin-walled member. This further minimizes the formation of sink marks and prevents warping of the cabinet body 1. Because the cabinet body 1 can be made thin walled, the molding speed may be increased, and a lesser amount of resin used, thereby significantly reducing the overall cost of the cabinet.

Figure 4:
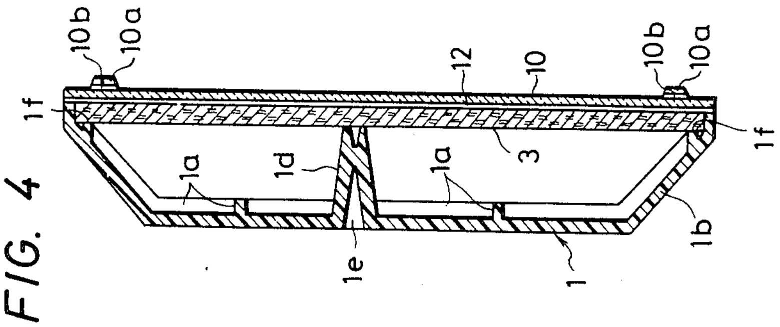
FIGS. 4 and 5 are, respectively, a cross-sectional and a rear view of the speaker cabinet of FIG. 1.
Figure 6:
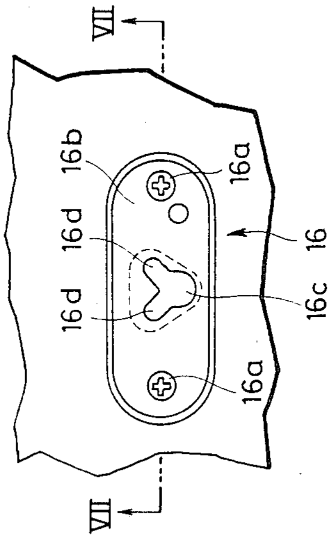
FIG. 6 is an enlarged fragmentary view showing the construction of a mounting fixture of the speaker cabinet of FIG. 1.
Figure 5:
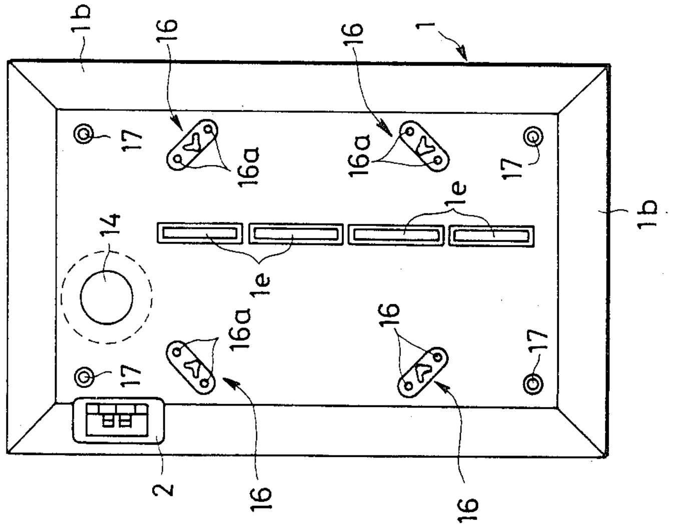

Referring now to FIGS. 4 and 5, a hollow 1e is formed at the rear of the elongated rib 1d to further reduce the weight of the cabinet body 1. The length of the rib 1*d* should be less than the distance between the side walls 1*b* of the body 1 adjacent its ends. The space between the ends of the elongated rib 1*d* and the adjacent side walls prevents standing waves from arising inside the cabinet body 1, and thereby suppresses resonances within the cabinet body 1.

Figure 3:
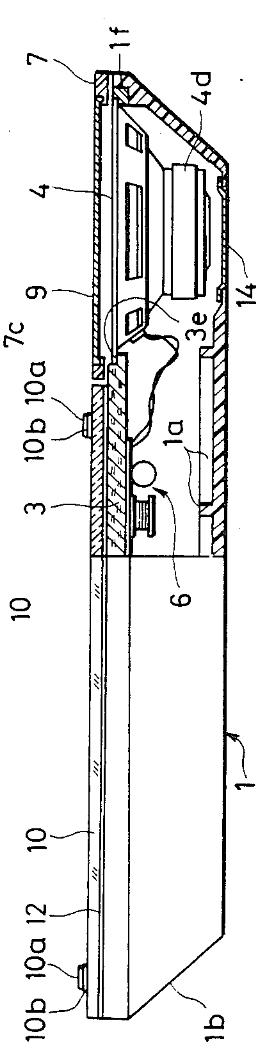

With reference to FIGS. 1, 3 and 4, the cabinet body 1 is formed along the edges of its front side with a stepped portion into which a baffle board 3 is fitted. A sealing member 3*a* (FIG. 1) seals the periphery of the baffle board 3 to the cabinet body 1. The baffle board 3 is secured by set screws to the cabinet body 1. The baffle board 3 may be a press-formed particle board or the like, having a desired sound-absorbing characteristic. The forward edge of the elongated rib 1*d* abuts the rear surface of the baffle board 3, with a sealing member 3*b* (FIG. 1) interposed therebetween. The elongated rib 1*d* is connected to the baffle board 3 by set screws (not shown), thereby rendering the cabinet as a whole rigid.

Glass wool or the like (not shown) may be inserted as a sound-absorbing member in the space defined between the cabinet body 1 and the baffle board 3.

Figure 11:
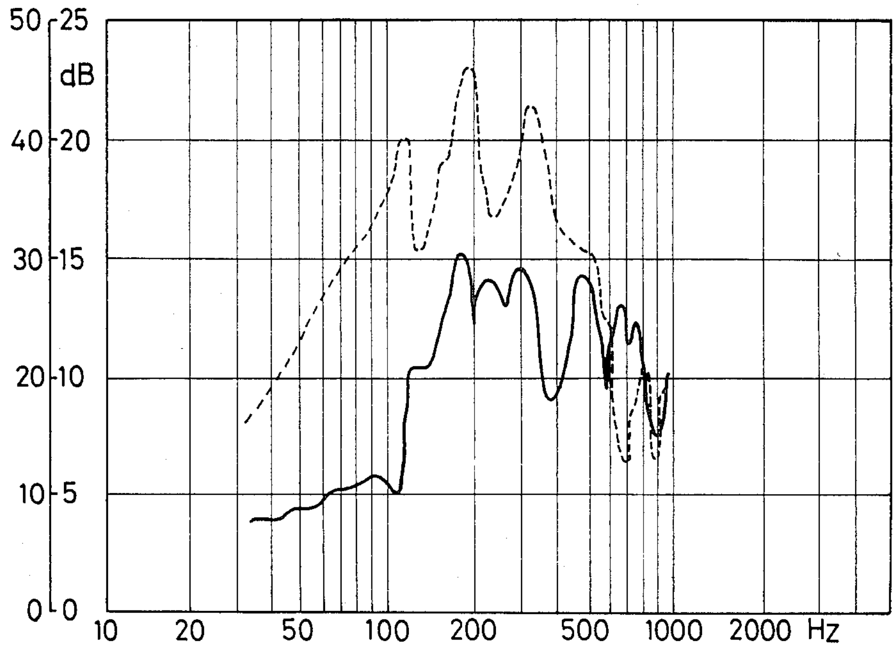
FIG. 11 is a frequency response diagram showing the relationship between the frequency of an applied sound signal and the oscillation level of a baffle board used in the speaker of the invention.

FIG. 11 is a frequency characteristic diagram showing the oscillation frequency and oscillation level of the baffle board 3 in the case where the elongated rib 1*d* is provided (solid line) and where the elongated rib *1d* is omitted (dashed line). As is apparent from this diagram, the oscillation level of the baffle board 3 is substantially reduced by the provision of the elongated rib *1d*.

Although a single elongated rib 1*d* is provided in the embodiment illustrated in the accompanying drawings, a plurality of such ribs may be provided if desired. Specifically, for larger size speakers, it may be desirable to provide plural ones of such ribs. Further, if desired, the elongated rib or ribs 1*d* may be slanted relative to a plane perpendicular to the front face of the cabinet body 1, but should be maintained parallel to the sides of the cabinet body 1.

With reference to FIG. 1, a woofer 4 and a tweeter 5 are mounted on the baffle board 3 closely adjacent one another at one side thereof. The rear end of the tweeter 5 is inserted into an opening 3*c* formed in the baffle board 3, and the tweeter 5 is secured with set screws 5*a* to the baffle board 3. Similarly, the rear end of the woofer 4 is inserted in an opening 3*d* formed in the baffle board 3, and the woofer 4 secured with set screws 4*a* to supports lg projecting from the interior of the cabinet body 1. A sealing member 4*c* may be provided between the rear of the flange of the woofer 4 and the baffle board 3. The area in the baffle board 3 where the woofer 4 is received is preferably recessed to a depth substantially equal to the thickness of the flange 4*b* of the woofer 4. This is done to reduce the thickness of the cabinet as a whole. In addition, the provision of the recess 3*e* in the baffle board 3 facilitates the correct positioning of the woofer 4 on the baffle board 3. Of course, a recess may also be formed to accommodate the tweeter 5.

As mentioned previously, the baffle board 3 is rigidly attached to the cabinet body 1 to reduce the amount of oscillation of the baffle board 3. Attaching the baffle board 3 to the cabinet body 1 with the same set screws 4*a* as are used to secure the woofer 4 to the baffle board 3 reduces the total number of parts in the speaker and reduces the number of assembly steps.

A printed circuit board assembly 6 is fixedly mounted to the rear of the baffle board 3 in an area near the woofer 4. The printed circuit board assembly 6 contains a frequency-dividing network for dividing the input signal between the woofer 4 and the tweeter 5.

Figure 2:
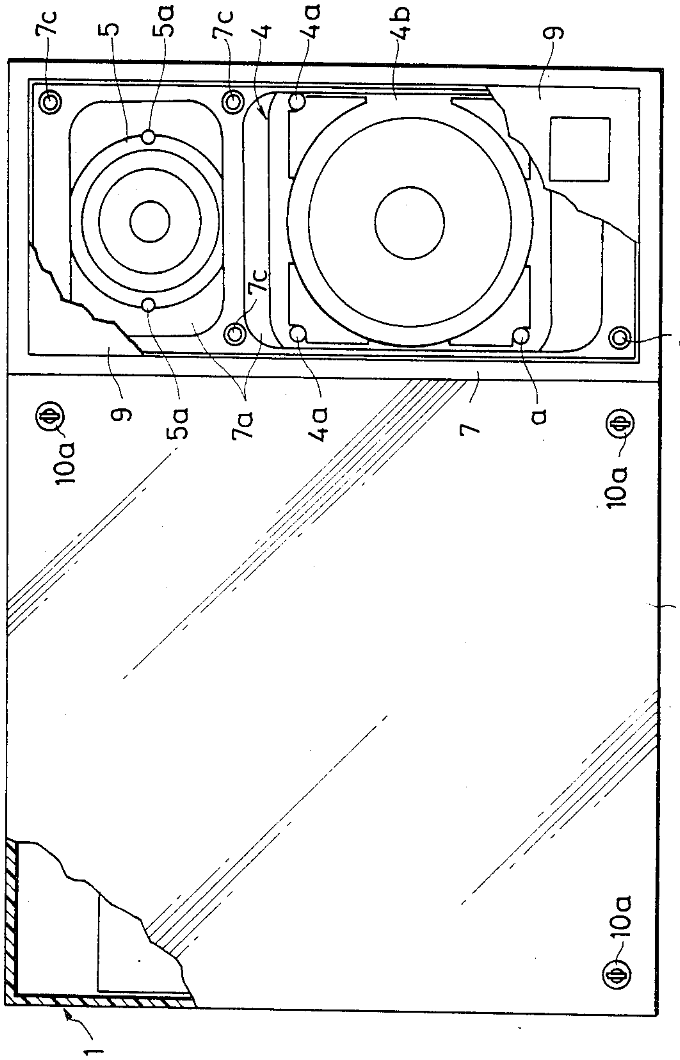
FIGS. 2 and 3 are, respectively, a plan view and a front view of the speaker cabinet of FIG. 1, shown partially in cross section.

A grille board 7, formed of resin or the like, is provided over the woofer 4 and tweeter 5, as shown in FIGS. 2 and 3. The grille board 7 is rectangular in shape, and includes openings 7*a* formed in areas corresponding to the diaphragms of the woofer 4 and tweeter 5. The openings 7*a* are separated by a partitioning segment at a position corresponding to the space between the woofer 4 and tweeter 5. Set screws 7*c* secure the grille board 7 to the baffle board 3, specifically, the set screws 7*c* are screwed into projections 1h integrally formed in the cabinet body (FIG. 1). This prevents the grille board 7 from being warped or otherwise distorted due to variations in temperature, humidity and other such factors. By using the same screws 7*c* which secure the grille board 7 to the baffle board 3 to hold the baffle board 3 rigidly to the cabinet body 1, the number of parts is further reduced, and again the number of assembly steps is decreased.

Figure 9A:
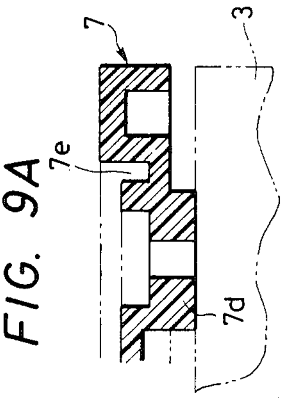
FIGS. 9A, 9B and 9C are cross-sectional views taken along lines IXa—IXa, IXb—IXb, and IXc—IXc in FIG. 8A.
Figure 8B:
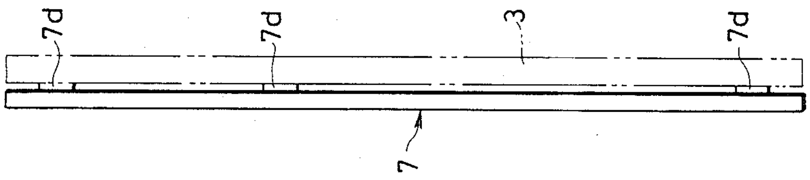
FIGS. 8A and 8B are, respectively, a plan view and a front view of a grille board used in the speaker cabinet of FIG. 1.

As seen in FIGS. 8B and 9A, the grille board 7 is provided at its rear with abutment bosses 7d at the position of each of the screws 7*c*, projecting rearwardly towards the baffle board 3. By spacing the grille board 7 from the front surface of the baffle board 3 by the height of the bosses 7*d*, the grille board 7 is prevented from vibrating.

Figure 9B:
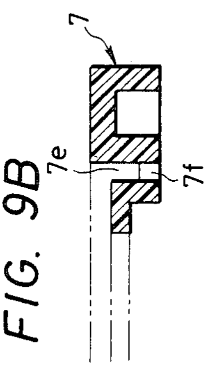
Figure 9C:
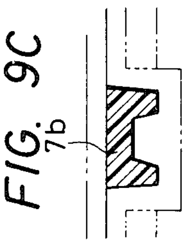
Figure 8A:
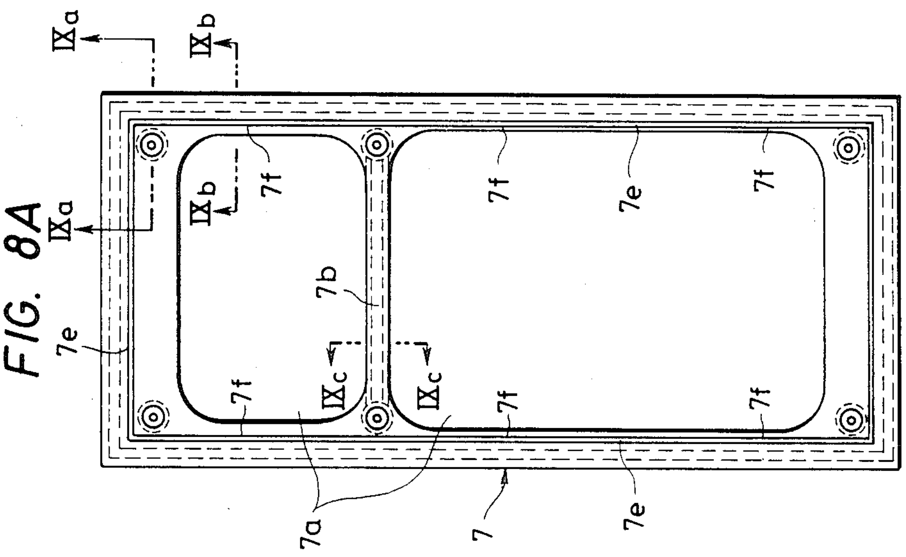
Figure 10C:
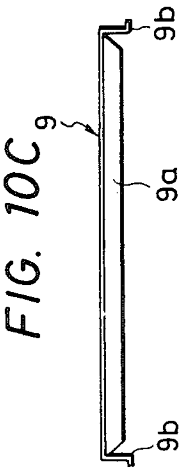
FIGS. 10A, 10B and 10C are, respectively, a plan view, a front view and a side view of a front grille used with the speaker cabinet of FIG. 1.
Figure 10A:
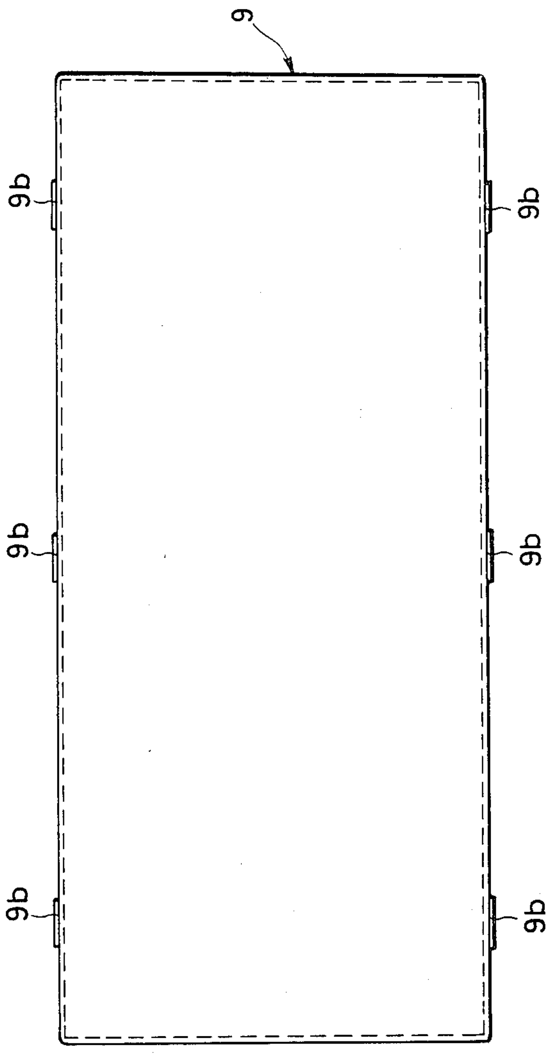
Figure 10B:
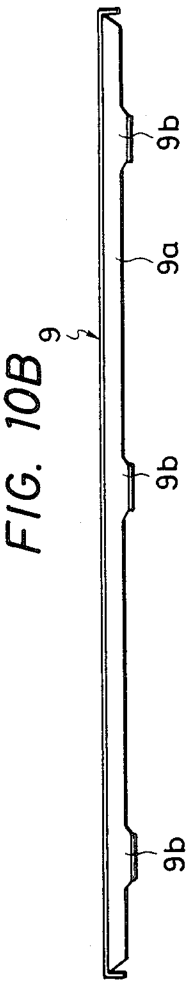

As seen in FIGS. 8A, 9A and 9B, a groove 7e is formed around the periphery of the front surface of the grille board 7. Into the groove 7*a* is received the frame 9*a* of a sound-porous front grille 9. Specifically, as seen best in FIGS. 10A through 10C, the frame 9*a* of the front grille 9 has engaging protrusions 9*b*, for instance, six in number. The tip of each engaging protrusion 9*b* is bent outwardly. Corresponding recesses 7*f* are formed along the groove 7*e*. When the front grille 9 is assembled to the grille board 7, the engaging protrusions 9*b* are flexed to fit in the recesses 7*f*, thereby providing firm engagement between the front grille 9 and the grille board 7. With this construction, firm engagement between the front grille 9 and grille board 7 is ensured, even in the case that the two members are relatively thin walled. This allows the weight of the speaker cabinet to be further reduced.

Except for the portion of the baffle board 3 covered by the grille board 7 and front grille 9, a rigid plate 10, made of glass or the like, is mounted to further reduce the amount of oscillation of the baffle board 3. The plate 10 is secured with, for example, four screws 10*a* to the baffle board 3. The screws 10*a* may be of a type which can be turned with a coin or the like for convenience. A spacer 10*b*, preferably made of a resin material and which serves as a washer, is interposed between each of these screws 10*a* and plate 10.

With reference again to FIG. 10, strips 11 of a tape formed, for example, of a foam material, are placed parallel to one another on the front face of the baffle board 3 under the plate 10. Between the strips 11 and the rear side of the rigid plate 10 are disposed a vibration-absorbing plate 12, which may be made of a vibration-absorbing paper or the like, and a sheet 13 of a colored paper. For the plate 12, if desired, a foamed styrole material can be employed. Also, the plate 10 may be made of cork, in which case the colored paper can, of course, be omitted. The use of a glass plate is, however, preferred in that a photograph or picture may be arranged between the colored paper 13 and the glass plate 10 in that case. However, in the case that the plate 10 is made of cork, it is still possible to attach a photograph or the like to the plate 10 by the use of thumbtacks.

The construction of the rear of the cabinet will now be described in detail. A circular opening is formed in the rear of the cabinet body 1 at a position corresponding to the yoke 4a of the woofer 4. In this opening is received a substantially dish-shaped heat radiating member 14, which is formed of a material having a high thermal conductivity and which is resistant to distortion caused by heating. The purpose of the member 14 is to dissipate heat generated in the yoke 4*d* of the woofer 4 so that deformation of the cabinet body 1 due to heating is avoided.

Figure 12:
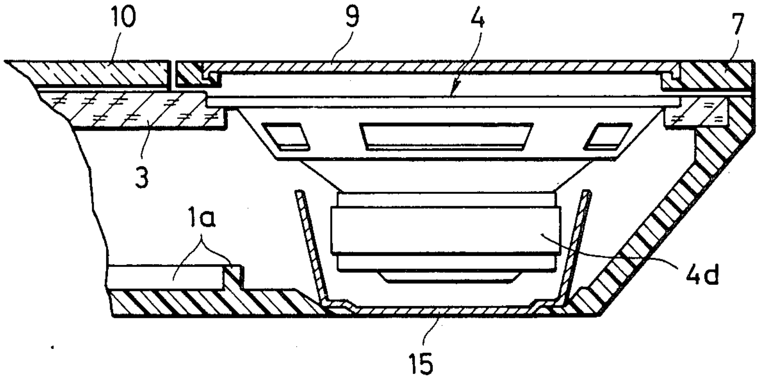
FIG. 12 is a fragmentary-sectional view showing a speaker cabinet incorporating a modified form of a sound reflecting member.

FIG. 12 shows a modified form of the heat radiating member. In this embodiment, the radiating member 15 has a peripheral portion encircling the yoke 4*d* of the woofer 4, having a nearly bowl-type shape as a whole. By encircling the yoke 4*d* of the woofer 4, an enhanced heat dissipating effect is obtained.

Figure 7:
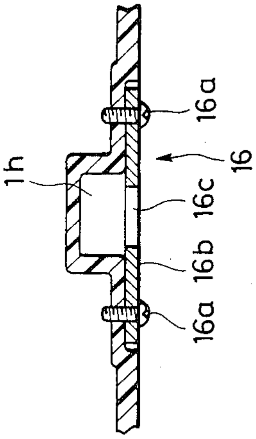
FIG. 7 is a cross-sectional view taken along a line VI—VI in FIG. 6.

Referring now to FIGS. 5 and 7, the speaker cabinet body is provided at its rear with four mounting members 16, arranged at positions such that the center of the rectangle defined by the four mounting members 16 is at the center of gravity of the complete speaker, including the cabinet body 1, baffle board 3, woofer 4, tweeter 5, rigid plate 10, and all other members. The mounting members 16 are provided for mounting the speaker to a wall or the like. Each of the mounting members 16 is formed by a concave 1*h* (FIG. 7) formed integrally with the rear of the cabinet body 1, and a metal fixture 16, which may be made of steel and which is secured to the cabinet body 1 with screws 16*a*. The concaves 1*h* are formed by depressing the back of the cabinet body 1 after injection during the molding process. Each metal fixture 16 has an opening 16*c* into which the head of the nail or screw secured to the wall where the cabinet is to be mounted is received. Preferably, each opening 16*c* has branches 16*d*, which are provided to restrict the movement of the speaker in the direction of gravity. The branches 16*d* extend substantially perpendicular to one another and have a width less than the outer diameter of the head of the nail or screw secured to the wall. Spacers 17, formed of rubber or the like, separate the rear surface of the cabinet body 1 from the wall upon which the speaker is mounted.

As described above, the speaker cabinet according to the invention includes side walls which incline inwardly toward the rear of the speaker cabinet. Because the distances between opposite side walls of the speaker cabinet body vary in a direction perpendicular to the plane of the baffle board, standing wave patterns are prevented from occurring. This eliminates resonances from the speaker cabinet.

Further, because the signal terminal plate is formed on one of the inclined side walls, it is not visible from the front of the cabinet. This improves the appearance of the cabinet as a whole. Also, with such mounting of the signal terminal plate, the signal cable can readily be connected to or disconnected from the terminals on the signal terminal plate while the speaker cabinet is mounted to the wall.

Still further, as mentioned above, the inventive speaker cabinet is advantageous in that the resin molding operation is quite simple, the resin being able to flow smoothly during molding with substantially no production of sink marks. Also, inclining the side walls toward the back of the cabinet makes the cabinet appear very thin, thereby improving the overall appearance of the cabinet.

This completes the description of the preferred embodiments of the invention. Although preferred embodiments have been described, it is believed that numerous modifications and alterations thereto would be apparent to one of ordinary skill in the art without departing from the spirit or scope of the invention.

We claim:

1. In a molded resin speaker cabinet, the improvement wherein said cabinet has a back wall and a plurality of side walls, at least one side wall of said cabinet being inclined inwardly towards said back wall of said cabinet; wherein at least one elongated rib is integrally formed with said back wall inside of said cabinet body and extends longitudinally inside the cabinet body parallel to two of said side walls, and further comprising a substantially planar baffle board secured in a front opening in said cabinet body, said baffle board having a rear surface in abutment with said elongated rib.

2. The speaker cabinet of claim 1, wherein said speaker cabinet is rectangularly shaped, and all of said plurality of side walls of said cabinet are inclined inwardly towards said back of said cabinet.

3. The speaker cabinet of claim 2, further comprising a signal terminal plate is disposed on at least one of said side walls of said cabinet.

4. The speaker cabinet of claim 1, wherein said rear surface of said baffle board is rigidly secured to said elongated rib.

5. The speaker cabinet of claim 4, further comprising a sealing member disposed between said elongated rib and said rear surface of said baffle board.

6. The speaker cabinet of claim 1, wherein said baffle board has openings disposed therein and further comprising a tweeter and a woofer mounted in said openings of said baffle board.

7. The speaker cabinet of claim 6, wherein a recess is formed in said baffle board to receive a flange of said woofer, said recess having a depth substantially equal to a depth of said flange of said woofer.

8. The speaker cabinet of claim 6, further comprising a grille board having openings corresponding to positions of diaphragms of said tweeter and said woofer, said grille board being secured to said baffle board over fronts of said tweeter and said woofer.

9. The speaker cabinet of claim 8, wherein said grille board is secured to said cabinet body with screws passing through said baffle board.

10. The speaker cabinet of claim 9, wherein said grille board has a groove formed around a front peripheral edge thereof, and further comprising a front grille having a peripheral frame adapted to engage in said groove to secure said front grille to said grille board.

11. In a molded resin speaker cabinet, the improvement wherein said cabinet has a back wall and a plurality of side walls,; wherein at least one elongated rib is integrally formed with said back wall inside of said cabinet body and extends longitudinally inside the cabinet body parallel to two of said side walls, and further comprising a baffle board secured in a front opening in said cabinet body, said baffle board having a rear surface in abutment with said elongated rib;

said speaker cabinet being rectangularly shaped, and all of said plurality of side walls of said cabinet being inclined inwardly towards said back of said cabinet;

a tweeter and a woofer being mounted in openings of said baffle board; and a rigid plate being secured to a front portion of said baffle board outside an area of said tweeter and said woofer.

12. The speaker cabinet of claim 11, further comprising sound absorbing means disposed between said rigid plate and said baffle board.

13. The speaker cabinet of claim 12, wherein said sound absorbing means comprises a plurality of strips of a sound absorbing tape disposed parallel to one another on said front surface of said baffle board, and a plate of a sound absorbing material corresponding in size and shape to said rigid plate.

14. The speaker cabinet of claim 13, wherein said rigid plate is made of glass.

15. The speaker cabinet of claim 14, further comprising a plurality of screws for fixing said rigid plate to said cabinet body, said screws passing through said baffle board to rigidly secure secure said baffle board to said cabinet body.

16. In a molded resin speaker cabinet, the improvement wherein said cabinet has a back wall and a plurality of side walls,; wherein at least one elongated rib is integrally formed with said back wall inside of said cabinet body and extends longitudinally inside the cabinet body parallel to two of said side walls, and further comprising a baffle board secured in a front opening in said cabinet body, said baffle board having a rear surface in abutment with said elongated rib;

said speaker cabinet being rectangularly shaped, and all of said plurality of side walls of said cabinet being inclined inwardly towards said back wall of said cabinet;

a tweeter and a woofer being mounted in openings of said baffle board; and a recess being formed in said baffle board to receive a flange of said woofer, said recess having a depth substantially equal to a depth of said flange of said woofer; and said cabinet body being provided with an opening in a rear portion thereof corresponding to a location of a yoke of said woofer, and further comprising a heater radiating member disposed in said opening.

17. The speaker cabinet of claim 16, wherein said heat radiating member substantially surrounds said yoke of said woofer.

* * * * *